United States Patent [19]

Ohnuki et al.

[11] Patent Number: 4,712,218
[45] Date of Patent: Dec. 8, 1987

[54] METHOD OF AND APPARATUS FOR DRIVING SEMICONDUCTOR LASER

[75] Inventors: Nobutaka Ohnuki, Ohta; Masahiro Ojima, Kokubunji; Akira Arimoto, Musashimurayama; Naoki Chinone, Hachioji, all of Japan

[73] Assignee: Hitachi, Ltd., Tokyo, Japan

[21] Appl. No.: 590,871

[22] Filed: Mar. 19, 1984

[30] Foreign Application Priority Data

Mar. 18, 1983 [JP]  Japan ................... 58-44230

[51] Int. Cl.⁴ ............................................. H01S 3/00
[52] U.S. Cl. ........................................ 372/38; 372/44; 372/34; 372/31
[58] Field of Search .................. 378/43, 44, 26, 28, 378/29, 750, 38, 34, 31

[56] References Cited

U.S. PATENT DOCUMENTS

| | | | |
|---|---|---|---|
| 4,243,952 | 1/1981 | Patterson | 372/34 |
| 4,480,325 | 10/1984 | Aiki et al. | 372/43 |
| 4,484,331 | 11/1984 | Miller | 372/34 |
| 4,485,475 | 11/1984 | Large et al. | 372/34 |

*Primary Examiner*—Leon Scott, Jr.
*Attorney, Agent, or Firm*—Antonelli, Terry & Wands

[57] ABSTRACT

In order to suppress laser noise, a semiconductor laser oscillating in a single mode under direct-current drive is driven by a signal with a high frequency current superposed on a direct current. In particular, the laser is driven to be brought into continuous wave pulsed oscillation at a pulse width of at most 1.2 ns to achieve the desired noise suppression.

15 Claims, 5 Drawing Figures

METHOD OF AND APPARATUS FOR DRIVING SEMICONDUCTOR LASER

BACKGROUND OF THE INVENTION

The present invention relates to a method of driving a semiconductor laser, and more particularly to a driving method which suppresses laser noise in the case of employing a semiconductor laser as an information processing light source.

Semiconductor lasers are being put into practical use as pickup light sources for an optical video disc, an optical digital audio disc, etc. Since, however, the coherency of the semiconductor laser is too good, there is the problem that the laser output fluctuates due to the feedback of reflected light from an external optical system. Laser noise attributed to the feedback of the reflected light develops conspicuously in the semiconductor laser which oscillates in the single mode under direct-current drive. Further, the single mode laser has the problem that, even when the feedback of the reflected light is not involved, two or more modes oscillate competitively within a certain temperature range, to increase laser noise.

As a method for suppressing the laser noise of the single mode laser, a method wherein the laser is driven by superposing a high frequency current and is brought into multiple mode oscillation has been proposed in Japanese Patent Application No. 55-113515 filed Aug. 20, 1980 (changed from Japanese Utility Model Registration Application No. 54-99374 (filed July 20, 1979), and corresponding to Japanese Patent Application Laying-open No. 56-37834 (laid open Apr. 11, 1981), West-German Application No. P 3027318.8 (filed July 18, 1980) and U.S. Application Ser. No. 169794 (filed July 17, 1980), now abandoned and and refiled as Ser. No. 472,220 on Mar. 4, 1983, which issued as U.S. Pat. No. 4,480,325 on Oct. 30, 1984) which are hereby incorporated by reference regarding the state of the art in the field. In the multiple mode oscillation state, the coherency is lowered, and hence, the laser noise developing due to the feedback of the reflected light weakens. The laser noise attendant upon the temperature change, however, cannot always be suppressed merely by the high frequency superposition.

SUMMARY OF THE INVENTION

An object of the present invention is to provide a method of driving a semiconductor laser which is remarkably effective to suppress even laser noise attendant upon a temperature change by means of the high frequency superposition-laser drive.

The present invention for accomplishing such an object is characterized in that a semiconductor laser oscillating in a single mode under direct-current drive is driven by a signal with a hihg frequency current superposed on a direct current, so as to be brought into continuous wave pulsed oscillation at a pulse width of at most 1.2 ns.

DESCRIPTION OF THE PREFERRED EMBODIMENT

Now, the present invention will be described in detail with reference to the drawings.

Figure 1:
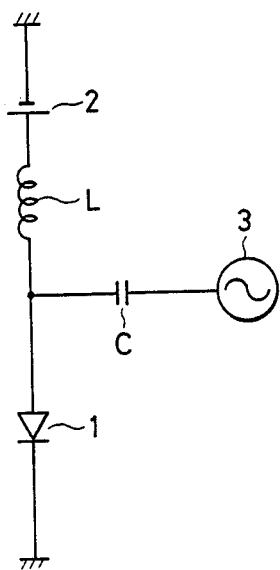
FIG. 1 is a diagram showing a circuit arrangement for performing the present invention.

FIG. 1 is a diagram illustrative of an example of a circuit arrangement for performing the present invention. A semiconductor laser 1 is driven by the superposed currents of a direct current source 2 and a high frequency current source 3. Letters L and C in FIG. 1 denote a coil and a capacitor, respectively, which are inserted so as to permit the two current sources to be isolated from one another during operation to prevent interference with each other. In the case of employing the semiconductor laser 1 as an information playback light source, a laser beam from the semiconductor laser 1 is guided to a recording medium and condensed as a minute light spot by the optical means of lenses etc.

Figure 2:
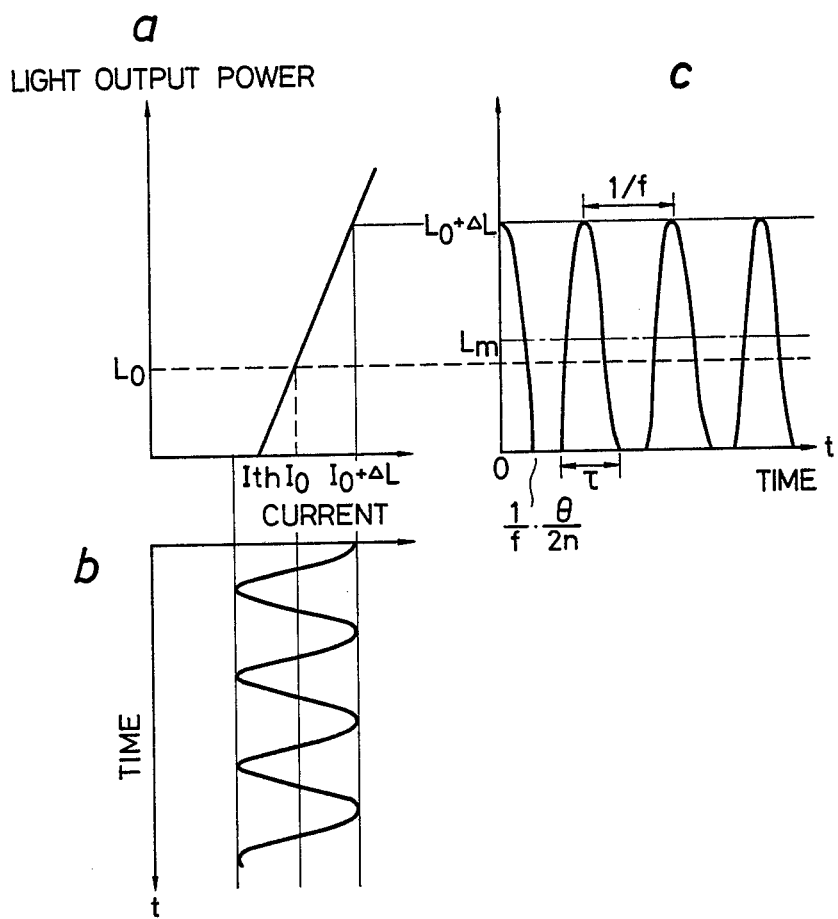
FIGS. 2(a), 2(b) and 2(c) are diagrams for explaining the time variation of a laser output during the drive of a laser with a high frequency current superposed.

FIG. 2(a) is a diagram showing the current-optical output characteristic of the semiconductor laser. The laser is driven by the current I in which the direct current $I_o$ and the high frequency current $\Delta I \cdot \cos(2\pi f t)$ are combined, e.g.:

$$I = I_o + \Delta I \cdot \cos(2\pi f t) \tag{1}$$

FIG. 2(b) shows the time variation of the laser driving current. At this time, the time variation of the laser output becomes as shown in FIG. 2(c). That is:

$$\left. \begin{array}{ll} L = L_o + \Delta L \cdot \cos(2\pi f t) & \text{for } I(t) > I_{th} \\ L = 0 & \text{for } I(t) < I_{th} \end{array} \right\} \tag{2}$$

where $I_{th}$ denotes the oscillation threshold current, and $L_o$ and $\Delta L$ denote the D.C. light output and A.C. light output corresponding to $I_o$ and $\Delta I$, respectively. The laser oscillates only when the laser driving current I exceeds $I_{th}$, so that the laser output L becomes continuous wave pulsed oscillation. The high frequency current is set at a sufficiently large amplitude so that the laser oscillation may be turned "on" and "off" at the high frequency as described above. Even in a semiconductor laser having a uniform spectral spread, several longitudinal modes laser-oscillate at the rise of laser oscillation. In contrast, when the laser oscillation is turned "on" and "off" at the high frequency as described above, a multiple longitudinal mode oscillation state is held, and the continuous wave pulsed oscillation is established. The high frequency current is defined by the frequency f and the amplitude $\Delta I$, while the continuous wave pulses are defined by a pulse repetition frequency f and a modulation depth $\eta$:

$$\eta = L_m / L_o \tag{3}$$

Here, $L_m$ denotes the average optical output during the modulation.

The relationship between the pulse width $\tau$ and f, $\eta$ is expressed by:

$$\left. \begin{array}{l} \tau = \dfrac{1}{f} \cdot \dfrac{\theta}{\pi} \\ \eta = (\theta - \tan\theta)/\pi \end{array} \right\} \tag{4}$$

Next, laser noise during the high frequency modulation will be described. Here, the semiconductor laser used was an MCSP (Modified Channeled Substrate Planar) single mode laser having a wavelength of 780 nm and $I_{th} = 50$ mA. The laser was operated at an average optical output $L_m = 3$ mW.

Figure 3:
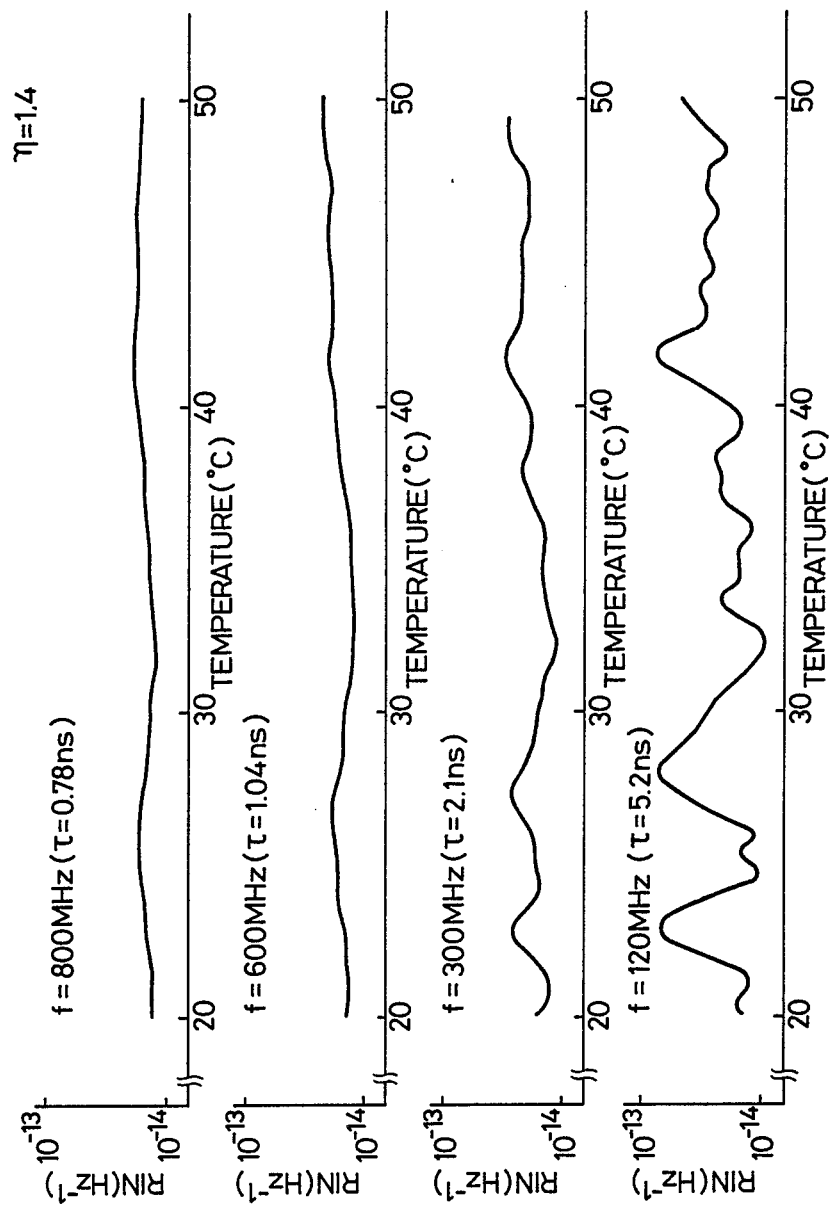

FIG. 3 shows the temperature variation of laser noise in the absence of the feedback of reflected light. The laser noise is indicated by RIN (Relative Intensity Noise):

$$RIN = \left(\frac{i_N}{i_{DC}}\right)^2 / \Delta f \quad (5)$$

Here, $i_N$ and $i_{DC}$ denote noise current and direct current in the case of photoelectrically converting and detecting the emergent light of the laser by means of a photodetector, respectively, and $\Delta f$ denotes the measured band width of the noise current. The RIN shown in FIG. 3 is at 8 MHz which is the signal frequency of an optical video disc. Here, the direct current $I_o$ was made greater than the oscillation threshold current $I_{th}$ (=50 mA) and $\Delta I$ was adjusted so as to establish $I_o = 57$ mA, $L_o = 2.1$ mW and the modulation depth of the high frequency modulation, $\eta = 1.4$, whereupon the frequency f was varied in a range of 120 MHz–800 MHz and the pulse width 96 in a range of 5.2 ns–0.78 ns. When f is 120 MHz ($\tau = 5.2$ ns) and 300 MHz ($\tau = 2.1$ ns), the RINs are unstable against the temperature variation, whereas when it is 600 MHz ($\tau = 1.04$ ns) and 800 MHz ($\tau = 0.78$ ns), they are stable against the temperature variation, and besides, the noise levels are low.

Figure 4:
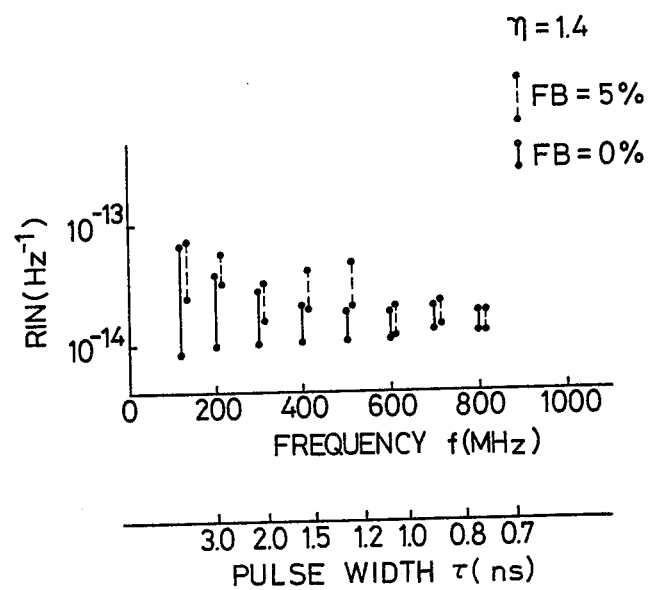
FIGS. 3 to 5 are diagrams for explaining the present invention.

In FIG. 4, f is taken on the axis of abscissas, while the changing magnitudes of the RINs at temperatures of 20° C.–50° C. are represented on the axis of ordinates. Each solid line corresponds to the case of FIG. 3 where no reflected light was fed back. Each broken line corresponds to a case where the emergent light of the laser was collimated into a parallel beam by a coupling lens having a numerical aperture of 0.15 and the collimated beam was thereafter condensed on a mirror, corresponding to an optical disc, by an objective lens of NA=0.53 so as to feed 5% thereof back to the laser. It is understood that, for f not lower than 600 MHz or for $\tau$ not greater than 1.04 ns, the RIN values are small, are stable against the temperatures and are scarcely affected by the feedback of the reflected light.

Figure 5:
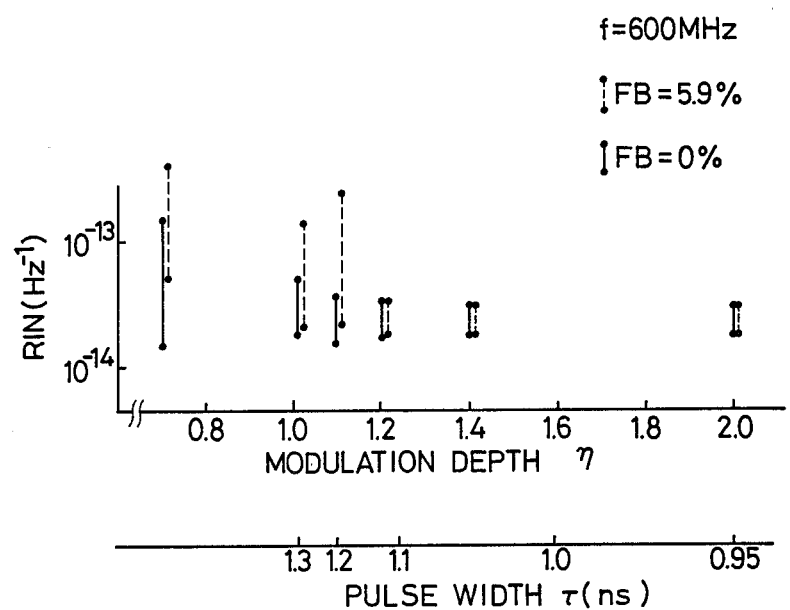

FIG. 5 illustrates the modulation depth-dependencies of the RINs with the frequency fixed at f=600 MHz. The RINs are indicated as their changing magnitudes in the temperature range of 20° C.–50° C. It is understood that, for $\eta$ not smaller than 1.2 or for $\tau$ not greater than 1.15 ns, the RIN values are small, are stable against the temperatures and are scarcely affected by the feedback of the reflected light.

As thus far described, the noise suppressing effect is greater as f is higher and $\eta$ is greater. As the pulse width $\tau$ of the light pulses is shorter, a larger number of modes will oscillate to attain the greater effect of noise suppression. The upper limit of the pulse width at which the noise suppressing effect becomes particularly remarkable is given from Equation (4) as follows in correspondence with $f \geq 550$ MHz and $\eta \geq 1.2$:

$\tau \leq 1.2$ ns

The upper limit of f is approximately 4 GHz in view of the modulation characteristic of the laser, and the upper limit of $\eta$ is approximately 3 in view of the present-day techniques of high frequency oscillator circuits. The lower limit of the light pulse width corresponding to these values is given from Equation (4) as follows:

$\tau \geq 0.07$ ns

To sum up, the effect of suppressing the laser noise becomes especially remarkable when the laser is brought into the multiple mode oscillation by performing the high frequency modulation so as to render the pulse width $\tau$ at most 1.2 ns.

A set forth above, the present invention can provide a semiconductor laser whose noise level is low and stable against temperatures and is scarcely affected by the feedback of reflected light. Therefore, an information playback apparatus of high quality can be provided by employing the semiconductor laser according to the present invention as a light source for information playback.

While we have shown and described only one embodiment in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:

1. A method of driving a semiconductor laser to suppress laser noise caused by temperature change characterized in that the semiconductor laser oscillating in a single mode under direct-current drive is driven independently of said direct current drive by a signal with a high frequency current so that said high frequency current is superposed on said direct current, so as to bring said laser into continuous wave pulsed oscillation at a pulse width of at most 1.2 ns to suppress said laser noise caused by temperature change.

2. A method of driving a semiconductor laser according to claim 1, wherein said high frequency current has a frequency of at least 550 MHz.

3. A method of driving a semiconductor laser according to claim 2, wherein a modulation depth, which is a ratio between an average value of the continuous wave pulses and an optical output of said semiconductor laser corresponding to said direct current, is at least 1.2.

4. A method of driving a semiconductor laser according to claim 2, wherein said direct current is greater than an oscillation threshold current of said semiconductor laser.

5. A method of driving a semiconductor laser according to claim 1, wherein a modulation depth, which is a ratio between an average value of the continuous wave pulses and an optical output of said semiconductor laser corresponding to said direct current, is at least 1.2.

6. A method of driving a semiconductor laser according to claim 5, wherein said direct current is greater than an oscillation threshold current of said semiconductor laser.

7. A method of driving a semiconductor laser according to claim 1, wherein said direct current is greater than an oscillation threshold current of said semiconductor laser.

8. An apparatus for driving a semiconductor laser to suppress laser noise caused by temperature change comprising:
- a direct current drive source coupled to said laser; and
- an alternating current drive source coupled to said laser to drive the laser independently of the direct current drive source so that an output of said direct current drive source and an output of said alternating current drive source are superimposed on one another to drive said laser, wherein a frequency and amplitude of said alternating current drive source and an amplitude of said direct current drive source are set so that said laser is brought into continuous wave pulsed oscillation at a pulse width equal to or less than 1.2 ns to suppress said laser noise caused by temperature change.

9. An apparatus according to claim 8, wherein the frequency of said alternating current drive source is greater than or equal to 550 Mhz.

10. An apparatus according to claim 9, wherein a modulation depth, which is a ratio between an average value of the continuous wave pulses and an optical output of said semiconductor laser corresponding to said direct current drive, is at least 1.2.

11. An apparatus according to claim 9, wherein an amplitude of said direct current is greater than an oscillation threshold current level of said semiconductor laser.

12. An apparatus according to claim 8, wherein a modulation depth, which is a ratio between an average value of the continuous wave pulses and an optical output of said semiconductor laser corresponding to said direct current drive, is at least 1.2

13. An apparatus according to claim 10, wherein an amplitude of said direct current is greater than an oscillation threshold current level of said semiconductor laser.

14. An apparatus according to claim 8, wherein an amplitude of said direct current is greater than an oscillation threshold current level of said semiconductor laser.

15. A method of driving a semiconductor laser to suppress laser noise caused by temperature changes within a temperature range of 20° C. to 50° C. characterized in that the semiconductor laser oscillating in a single mode under direct-current drive is driven independently of said direct current source by a signal with a high frequency current so that the high frequency current is superposed on said direct current, so as to bring said laser into continuous wave pulsed oscillation at a pulse width of at most 1.2 ns to suppress said laser noise caused by said temperature change.

* * * * *